(12) United States Patent
Mu

(10) Patent No.: US 9,979,188 B2
(45) Date of Patent: May 22, 2018

(54) LOW POWER HIGH SPEED INTERFACE

(71) Applicant: Telefonaktiebolaget LM Ericsson (publ), Stockholm (SE)

(72) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 216 days.

(21) Appl. No.: 15/027,448

(22) PCT Filed: Mar. 22, 2016

(86) PCT No.: PCT/EP2016/056206
§ 371 (c)(1),
(2) Date: Apr. 6, 2016

(87) PCT Pub. No.: WO2017/162269
PCT Pub. Date: Sep. 28, 2017

(65) Prior Publication Data
US 2018/0076618 A1    Mar. 15, 2018

(51) Int. Cl.
*H02H 9/04* (2006.01)
*H03H 11/28* (2006.01)
(Continued)

(52) U.S. Cl.
CPC ............ *H02H 9/046* (2013.01); *H03H 11/28* (2013.01); *H04B 5/0075* (2013.01);
(Continued)

(58) Field of Classification Search
CPC ...... H02H 9/046; H03H 11/28; H04B 5/0075; H04B 7/0413; H04L 25/0272;
(Continued)

(56) References Cited

U.S. PATENT DOCUMENTS 6,597,229 B1    7/2003  Koyata et al.
7,535,958 B2 *  5/2009  Best ..................... H04B 1/7183
                                                    375/130

(Continued)

FOREIGN PATENT DOCUMENTS

JP    2003224460 A    8/2003
WO    2008100494 A2   8/2008

OTHER PUBLICATIONS

Lin, Changgui et al., "A 2.4GHz Common-Gate LNA Using On-Chip Differential Inductors in a O.18um CMOS Technology", IEEE 2009 International Conference on Electrical, Communications, and Computers, Feb. 26, 2009,183-188.

(Continued)

*Primary Examiner* — Pablo Tran
(74) *Attorney, Agent, or Firm* — Murphy, Bilak & Homiller, PLLC

(57) ABSTRACT

An interface for inter-chip communication, comprises a transmitter part (TX) for transmitting a differential signal and a receiver part (RX) for receiving the differential signal, the transmitter part (TX) being provided in a first integrated circuit chip (CHIP A) and the receiver part (RX) being provided in a second integrated circuit chip (CHIP B). The transmitter part (TX) comprises a first transistor (Tx1) and a second transistor (Tx2) arranged in a common source configuration, and the receiver part (RX) comprises a third transistor (TR1) and a fourth transistor (TR2) arranged in a common gate configuration. Current flowing in the receiver part (RX) also flows through the transmitter part (TX).

14 Claims, 7 Drawing Sheets

(51) Int. Cl.
*H04B 5/00* (2006.01)
*H04L 25/00* (2006.01)
*H04L 25/02* (2006.01)
*H04B 7/0413* (2017.01)
*H01L 25/065* (2006.01)
*H01L 27/02* (2006.01)

(52) U.S. Cl.
CPC ...... *H04L 25/0272* (2013.01); *H04L 25/0282* (2013.01); *H01L 25/0655* (2013.01); *H01L 27/0292* (2013.01); *H04B 7/0413* (2013.01)

(58) Field of Classification Search
CPC ............... H04L 25/0282; H04L 25/063; H04L 25/0278; H04L 7/046; H01L 25/0655; H01L 27/0292; H03F 3/45179; H03F 2203/45008; H03F 2203/45306; H03F 2203/45588; H03F 3/45; H03K 3/01
See application file for complete search history.

(56) References Cited

U.S. PATENT DOCUMENTS

| | | | |
|---|---|---|---|
| 8,024,623 B2* | 9/2011 | Ho | H04B 5/0075 29/834 |
| 8,134,385 B2 | 3/2012 | Gwinn | |
| 8,368,174 B1 | 2/2013 | Jiang et al. | |
| 8,432,768 B2* | 4/2013 | Ware | G11C 7/04 365/233.11 |
| 8,688,153 B2* | 4/2014 | Komori | H04B 1/109 370/482 |
| 8,786,326 B2* | 7/2014 | Oh | G11C 7/1066 327/108 |
| 9,565,036 B2* | 2/2017 | Zerbe | H04L 25/0264 |
| 2002/0047942 A1 | 4/2002 | Vorenkamp et al. | |
| 2002/0105380 A1 | 8/2002 | Weber et al. | |
| 2003/0042984 A1 | 3/2003 | Moloudi et al. | |
| 2005/0181754 A1 | 8/2005 | Wu et al. | |
| 2006/0232349 A1 | 10/2006 | Kehrer et al. | |
| 2006/0234661 A1* | 10/2006 | Toyota | H03G 1/04 455/252.1 |
| 2008/0116943 A1 | 5/2008 | Nair | |
| 2008/0130396 A1* | 6/2008 | Gomm | G11C 8/12 365/233.11 |
| 2009/0284311 A1 | 11/2009 | Ito | |
| 2010/0066450 A1* | 3/2010 | Palmer | H03F 3/45179 330/261 |
| 2012/0013361 A1* | 1/2012 | Ware | H03K 19/017509 326/30 |
| 2012/0286877 A1 | 11/2012 | Koo et al. | |
| 2014/0145760 A1 | 5/2014 | Nguyen et al. | |

OTHER PUBLICATIONS

Min, Seungkee et al., "A 2mW CMOS MICS-Band BFSK Transceiver with Reconfigurable Antenna Interface", 2010 IEEE Radio Frequency Integrated Circuits Symposium, May 23, 2012, 289-292.

Wang, Peng et al., "A Novel Low-power Fully-differential Current-reuse Cascaded CG-CS-LNA for 6-9-GHz UWB Receivers", 17th IEEE International Conferences on Electronics, Circuits, and Systems (ICECS), Dec. 12, 2010, 1188-1191.

Zhang, Feng et al., "A High Speed CMOS Transmitter and Rail-to-Rail Receiver", 4th IEEE International Symposium on Electronic Design, Test & Applications, Jan. 23, 2008, 67-70.

Bulzacchelli, John et al., "A 28Gb/s 4-Tap FFE/15-Tap DFE Serial Link Transceiver in 32nm SOI CMOS Technology", IEEE International Solid-State Circuits Conference, 20+ Gb/s Wireline Transceivers & Injection-Locked Clocking, Feb. 22, 2012, 324-325.

Chen, Xuning et al., "Design of Low-Power Short-Distance Opto-Electronic Transceiver Front-Ends with Scalable Supply Voltages and Frequencies", Proceedings of the 2008 international symposium on Low Power Electronics & Design, 2008, 277-282.

Jung, Jun Won et al., "A 25Gb/s 5.8mW CMOS Equalizer", IEEE International Solid-State Circuits Conference, Ultra-High-Speed Transceivers and Techniques, Feb. 10, 2014, 44-45.

Kromer, Christian et al., "A Low-Power 20-GHz 52-dB Transimpedance Amplifier in 80-nm CMOS", IEEE Journal of Solid-State Circuits, vol. 39, No. 6, Jun. 2004, 885-894.

Ogata, Yuuki et al., "32Gb/s 28nm CMOS Time-Interleaved Transmitter Compatible with NRZ Receiver with DFE", IEEE International Solid-State Circuits Conference, Ultra-High-Speed Transceivers and Equalizers, Feb. 18, 2013, 40-41.

* cited by examiner

LOW POWER HIGH SPEED INTERFACE

FIELD OF THE DISCLOSURE

The present disclosure relates to an interface and an electronic apparatus comprising the interface, and has application to high data rate communication, and in particular, but not exclusively, to integrated circuits used for wireless communication.

BACKGROUND TO THE DISCLOSURE

The need for a low power high speed data interface is becoming increasingly important for high data rate communications. For example, for future fifth generation wireless communication systems, beamforming techniques using a phased array or a multiple-input-multiple-output (MIMO) array are being considered in which a huge amount of data needs to be transferred between elements. Therefore, a high speed data interface is required. As the assembly density of the array elements is extremely high, the interface should consume as little power as possible to avoid overheating and to reduce interference caused by the interface.

There is a requirement for improvements in interfacing.

U.S. Pat. No. 8,134,385 discloses current-mode transmission implemented in a cascode amplifier by splitting a cascode circuit into a front end and a back end to ensure wideband current-mode transmission of an audio signal. A transmission cable is located between the high impedance output of the front end and the low impedance input of the back end. The front end includes a first amplifying device, and the back end includes a second amplifying device. The front end is phantom powered by the back end using the same electrical conductors that carry the current-mode signal over the transmission cable.

SUMMARY OF THE PREFERRED EMBODIMENTS

According to a first aspect there is provided an interface for inter-chip communication, comprising:

a transmitter part for transmitting a differential signal and a receiver part for receiving the differential signal, the transmitter part being provided in a first integrated circuit chip and the receiver part being provided in a second integrated circuit chip; wherein the transmitter part comprises:

a first transmitter input for an input binary signal and a second transmitter input for the complement of the input binary signal;

a first transmitter output for a first part of the differential signal and a second transmitter output for a second, complementary part of the differential signal;

a first transistor having a first gate coupled to the first transmitter input, a first source coupled to a first node, and a first drain coupled to the first transmitter output;

a second transistor having a second gate coupled to the second transmitter input, a second source coupled to the first node, and a second drain coupled to the second transmitter output; and wherein the first node is coupled to a first voltage rail by means of a first coupling element; and wherein the receiver part comprises:

a first receiver input coupled to the first transmitter output for receiving the first part of the differential signal and a second receiver input coupled to the second transmitter output for receiving the second, complementary part of the differential signal;

a first receiver output for an output binary signal and a second receiver output for the complement of the output binary signal;

a third transistor having a third gate coupled to a first bias voltage, a third source coupled to the first receiver input, a third drain coupled to the first receiver output, the third drain also coupled to a second voltage rail by means of a first inductive load; and a fourth transistor having a fourth gate coupled to the first bias voltage, a fourth source coupled to the second receiver input, a fourth drain coupled to the second receiver output, the fourth drain also coupled to the second voltage rail by means of a second inductive load.

Therefore, the first and second transistors may be arranged in a common source configuration as part of the transmitter part, thereby forming a common source stage, and the third and fourth transistors may be arranged in a common gate configuration as part of the receiver part, thereby forming a common gate stage. Output currents of the common source stage may be sunk in the sources of the common gate stage with low impedance, thereby enabling the voltage gain to be low, and therefore enabling the Miller capacitance effect to be low, and consequently enabling the interface to have a high bandwidth and fast speed of response. Furthermore, power consumption may be low, because the current flowing through the receiver part may be re-used in the transmitter part and vice versa, that is, the current flowing through the transmitter part may be re-used in the receiver part. In other words, the current that flows between the first and second voltage rails flows through both the transmitter part and the receiver part. Separate power supplies are not required for the transmitter part and receiver part. The same power supply may be used for both the transmitter part and the receiver part. Moreover, the interface has low complexity. The first and second inductive loads enable a high bandwidth.

In the transmitter part, the first drain may be coupled to the first transmitter output by means of a first inductive element and the second drain may be coupled to the second transmitter output by means of a second inductive element. This feature enables parasitic capacitance, in particular of the first and second transmitter outputs, to be compensated by the inductance of the first and second inductive elements, thereby enabling a high bandwidth.

The first and second inductive elements may be arranged to have mutual inductance. This feature enables the inductance to be increased without requiring additional chip area for the first and second inductive elements, or conversely enables the inductance to be provided using a smaller chip area.

Transmitter part may comprise:

a first electrostatic discharge protection circuit coupled to the first drain, such that the first electrostatic discharge protection circuit is coupled to the first transmitter output by means of the first inductive element; and a second electrostatic discharge protection circuit coupled to the second drain, such that the second electrostatic discharge protection circuit is coupled to the second transmitter output by means of the second inductive element.

This feature provides protection against electrostatic discharge whilst enabling parasitic capacitance, in particular of the first and second transmitter outputs, to be compensated by the inductance of the first and second inductive elements, thereby enabling a high bandwidth.

The transmitter part may comprise a first variable resistance element coupled between the first drain and the second drain. This feature enables, by adjustment of the resistance, improved impedance matching of the transmitter part to the receiver part and any intervening interconnections such as transmission lines.

In the receiver part, the third source may be coupled to the first receiver input by means of a third inductive element and the fourth source may be coupled to the second receiver input by means of a fourth inductive element. This feature enables parasitic capacitance, in particular of the first and second receiver inputs, to be compensated by the inductance of the third and fourth inductive elements, thereby enabling a high bandwidth.

The third and fourth inductive elements may be arranged to have mutual inductance. This feature enables the inductance to be increased without requiring additional chip area for the third and fourth inductive elements, or conversely enables the inductance to be provided using a smaller chip area.

The receiver part may comprise:
a third electrostatic discharge protection circuit coupled to the third source, such that the third electrostatic discharge protection circuit is coupled to the first receiver input by means of the third inductive element; and
a fourth electrostatic discharge protection circuit coupled to the fourth source, such that the fourth electrostatic discharge protection circuit is coupled to the second receiver input by means of the fourth inductive element.

This feature provides protection against electrostatic discharge whilst enabling parasitic capacitance, in particular of the first and second receiver inputs, to be compensated by the inductance of the third and fourth inductive elements, thereby enabling a high bandwidth.

The receiver part may comprise a second variable resistance element coupled between the third source and the fourth source. This feature enables, by adjustment of the resistance, improved impedance matching of the receiver part to the transmitter part and any intervening interconnections such as transmission lines.

The first and second inductive loads may be arranged to have mutual inductance. This feature enables the inductance to be increased without requiring additional chip area for the first and second inductive loads, or conversely enables the inductance to be provided using a smaller chip area.

The first bias voltage may be an adjustable voltage. This enables a bias voltage applied to the third and fourth gates to be adjusted to improve the reflection coefficient of the receiver part by adjusting the direct current (DC) flowing in the interface, which adjusts the input impedance of the receiver part.

There is also provided an electronic apparatus comprising an interface according to the first aspect.

The electronic apparatus may comprise an output stage, the output stage comprising:
a first p-channel transistor having a fifth source coupled to the first receiver output, a fifth gate coupled to a second bias voltage, and a fifth drain;
a second p-channel transistor having a sixth source coupled to the second receiver output, a sixth gate coupled to the second bias voltage, and a sixth drain;
a first n-channel transistor having seventh drain coupled to the fifth drain, a seventh gate coupled to the seventh drain, and a seventh source coupled to a third voltage rail;
a second n-channel transistor having an eighth drain coupled to the sixth drain, an eighth gate coupled to the seventh gate, and an eighth source coupled to the third voltage rail; and
a first data output coupled to the sixth drain.

Therefore, in this feature, the first and second p-channel transistors may be arranged in a common gate configuration and the first and second n-channel transistors may be arranged as a current mirror. This feature enables a high bandwidth as the first and second p-channel transistors may have a better high frequency response than would the use of n-channel transistors in the common gate configuration.

The electronic apparatus may be a wireless communication device.

Preferred embodiments are described, by way of example only, with reference to the accompanying drawings.

DETAILED DESCRIPTION OF PREFERRED EMBODIMENTS

Figure 1:
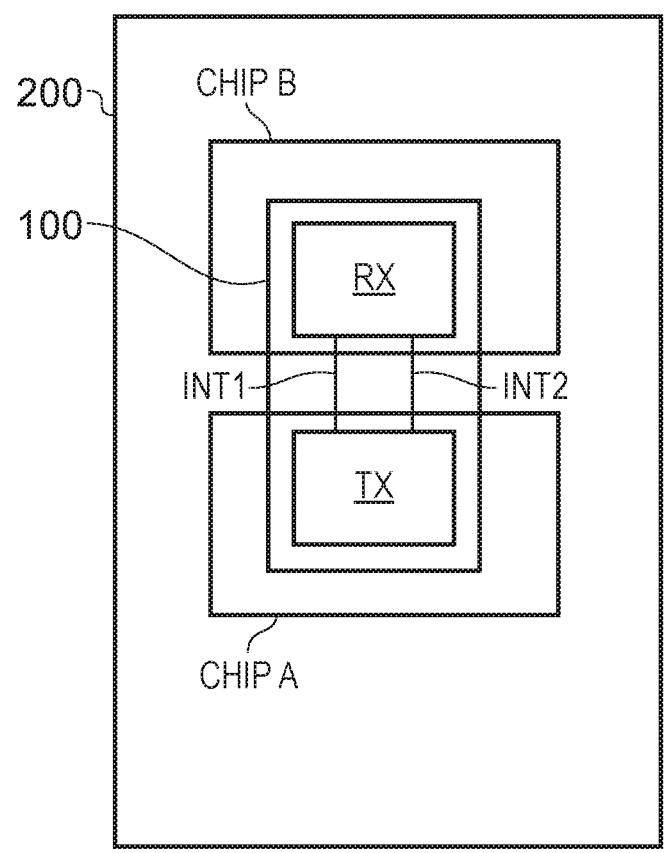
FIG. 1 is a block diagram of an electronic apparatus.

Referring to FIG. 1, an electronic apparatus 200, which may be, for example, a wireless communication device such as a mobile phone, comprises a first integrated circuit chip CHIP A and a second integrated circuit chip CHIP B. Inter-chip communication of information from the first integrated circuit chip to the second integrated circuit chip CHIP B is provided by means of an interface 100 that comprises a transmitter part TX located on the first integrated circuit chip CHIP A and a receiver part RX located on the second integrated circuit chip CHIP B. The interface includes a first interconnection INT1 and a second interconnection INT2, which may each be implemented as a transmission line. In particular, the transmission line may be a characteristic impedance controlled transmission line, for example a micro-strip line or a coplanar waveguide. In addition, the transmission line may be suitable for microwave transmission, enabling high speed data transmission between the transmitter part TX and the receiver part RX. The first and second interconnections INT1, INT2 support transmission of a signal from the transmitter part TX to the receiver part RX in a differential format, also known as a balanced format. Although only a single interface 100 is illustrated in FIG. 1, which transmits a single signal in a differential format, the first and second integrated circuit chips CHIP A, CHIP B may include many such interfaces, depending on the number of different signals and the amount of data required to be communicated. In addition, the location of the transmitter part TX and the receiver part RX may be swapped for some of these interfaces, depending on the direction in which the data is required to flow.

The interface 100, therefore, provides communication between the first and second integrated circuit chips CHIP A, CHIP B, that is, inter-chip communication. In some embodiments of the interface 100, the first and second integrated circuit chips CHIP A, CHIP B may be located in a single integrated circuit package, that is, both the first and second integrated circuit chips CHIP A, CHIP B may be located in the same integrated circuit package, in which case the interface 100 provides intra-package communication between the first and second integrated circuit chips CHIP A, CHIP B.

Figure 2:
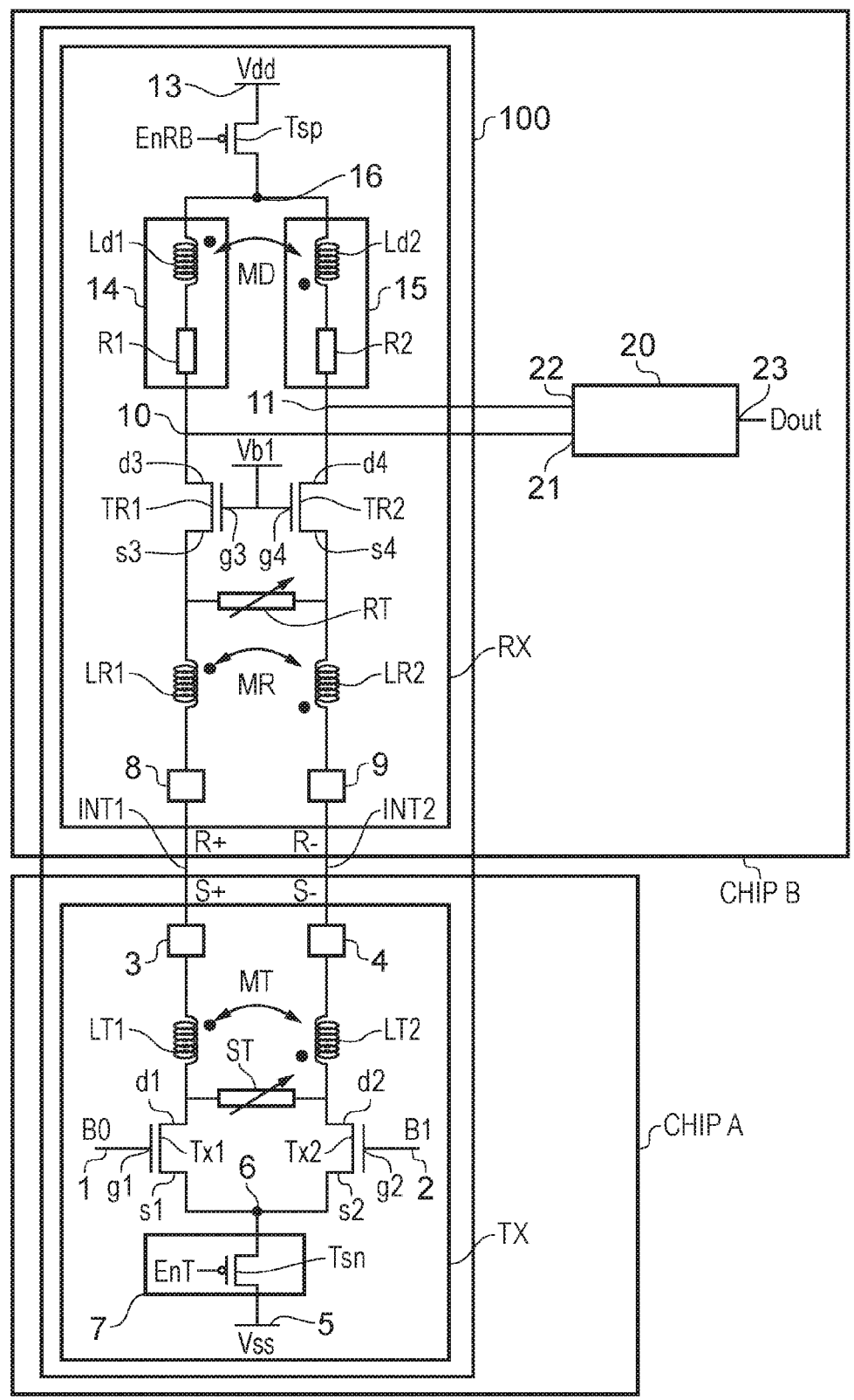
FIG. 2 is a schematic diagram of an interface.

Referring to FIG. 2 which illustrated the interface 100 in more detail, the interface 100 comprises the transmitter part TX for transmitting a differential signal S+, S− and a receiver part RX for receiving the differential signal S+, S− after it has been transmitted through the first and second interconnections INT1, INT2, the transmitter part TX being provided in the first integrated circuit chip CHIP A and the receiver part RX being provided in the second integrated circuit chip CHIP B. The differential signal S+, S− comprises a first signal part S+ and a second signal part S−, which are the inverse of each other. In FIG. 2, the received differential signal is denoted R+, R− as it may differ from the transmitted differential signal S+, S−, for example due to band limiting during transmission through the first and second interconnections INT1, INT2.

The transmitter part TX comprises a first transmitter input 1 for an input binary signal B0 and a second transmitter input 2 for the complement of the input binary signal B1, that is, if B0 represents binary one, then B1 represents binary zero, and vice versa. The transmitter TX also comprises a first transmitter output 3 for the first signal part S+ and a second transmitter output 4 for the second signal part S−. The first and second transmitter outputs 3, 4 may typically each comprise an integrated circuit connection pad, also referred to herein, for conciseness, as a pad.

The transmitter part TX comprises a first transistor Tx1 having a first gate g1 coupled to the first transmitter input 1, a first source s1 coupled to a first node 6, and a first drain d1 coupled to the first transmitter output 3 by means of, that is, via, a first inductive element LT1. The transmitter part TX also comprises a second transistor Tx2 having a second gate g2 coupled to the second transmitter input 2, a second source s2 coupled to the first node 6, and a second drain d2 coupled to the second transmitter output 4 by means of, that is, via, a second inductive element LT2. The first node 6 is coupled to a first voltage rail 5 by means of a first coupling element 7. The first voltage rail 5 provides a first voltage Vss, which may, for example, be 0V or ground. The first and second transistors Tx1, Tx2 are, therefore, arranged in a common source configuration, thereby forming a common source stage. In the embodiment of FIG. 2, the first coupling element 7 comprises a first coupling transistor Tsn which is arranged to operate as a switch for enabling and disabling the transmitter part TX in response to a transmit enable control signal EnT applied at a gate of the first coupling transistor Tsn. In other embodiments the first coupling element 7 may instead comprise an inductive coupling element or a resistive coupling element.

In some embodiments, the first and second inductive elements LT1, LT2 may be arranged to have mutual inductance, denoted MT in FIG. 2. In other embodiments, the first and second inductive elements LT1, LT2 may be arranged to have no mutual inductance, corresponding to MT=0. In further embodiments, the first and second inductive elements LT1, LT2 may each be omitted, each being replaced by a short-circuit such that the first drain d1 is coupled directly to the first transmitter output 3 and the second drain d2 is coupled directly to the second transmitter output 4. The inclusion of the first and second inductive elements LT1, LT2 enables parasitic capacitance to be at least partially compensated, thereby enabling a high bandwidth. The inclusion of mutual inductance enables the inductance to be increased without requiring additional chip area for the first and second inductive elements, or conversely enables the inductance to be provided using a smaller chip area.

In the embodiment of FIG. 2, the transmitter part TX comprises a first variable resistance element ST coupled between the first drain d1 and the second drain d2. By adjusting the resistance of the first variable resistance element ST, the impedance matching of the transmitter part to the receiver part, and any intervening interconnections such as transmission lines, may be improved. In other embodiments the first variable resistance element ST may be omitted, being replaced instead by an open-circuit between the first drain d1 and the second drain d2, or by a fixed resistance.

Continuing to refer to FIG. 2, the receiver part RX comprises a first receiver input 8 coupled to the first transmitter output 3, by means of the first interconnection INT1, for receiving the first signal part S+ of the differential signal S+, S− and a second receiver input 9 coupled to the second transmitter output 4 for receiving the second signal part S− of the differential signal S+, S−. The first and second receiver inputs 8, 9 may typically each comprise an integrated circuit connection pad, also referred to herein for conciseness as a pad. The receiver part RX also comprises a first receiver output 10 for an output binary signal corresponding to the input binary signal B0 and a second receiver output 11 for the complement of the output binary signal, corresponding to the complement of the input binary signal B1.

The receiver part RX comprises a third transistor TR1 having a third gate g3 coupled to a first bias voltage Vb1, a third source s3 coupled to the first receiver input 8 by means of, that is, via, a third inductive element LR1, and a third drain d3 coupled to the first receiver output 10. The third drain d3 is also coupled to a second node 16 by means of a first inductive load 14, and the second node 16 is coupled to a second voltage rail 13 by means of a second coupling transistor Tsp. The receiver part RX also comprises a fourth transistor TR2 having a fourth gate g4 coupled to the first bias voltage Vb1, a fourth source s4 coupled to the second receiver input 9 by means of, that is, via, a fourth inductive element LR2, and a fourth drain d4 coupled to the second receiver output 11. The fourth drain d4 is also coupled to the second node 16 by means of a second inductive load 15. Therefore, the third and fourth transistors TR1, TR2 are arranged in a common gate configuration, and convert currents flowing between the transmitter part TX and the receiver part RX into voltages at the third and fourth drains D3, D4, and at the first and second receiver output 10, 11. The transmitter part TX and receiver part RX do not require separate power supplies because the current that flows through the transmitter part TX also flows through the receiver part RX, and vice versa, that is, the current that flows through the receiver part RX also flows through the transmitter part TX, between the first and second voltage rails 5, 13. In other words, the same current, ignoring any leakage current, such as gate leakage from the first, second, third or fourth transistors Tx1, Tx2, TR1, TR2, or leakage from the electrostatic discharge protection devices described later, or leakage from isolating layers of a transmission line forming the first and second interconnections INT1, INT2, flows through the transmitter part TX and the receiver part RX. The second voltage rail 13 may be considered to supply current, specifically DC current, and power to the receiver part RX, and also to supply current, specifically DC current, and power through the first and second interconnections INT1, INT2 to the transmitter part TX. Likewise, in other embodiments, depending on the relative magnitude of the first and second voltages Vss, Vdd, the first voltage rail 5 may be considered to supply current, specifically DC current, and power to the transmitter part TX, and also to supply current, specifically DC current, and power through the first and second interconnections INT1, INT2 to the receiver part RX. Therefore, the current flowing in the transmitter part TX may be considered to be re-used in the receiver part RX, or conversely, the current flowing in the receiver part RX may be considered to be re-used in the transmitter part TX, and therefore a single power supply is sufficient.

The first and third transistors Tx1, TR1 are arranged in a first cascode, and likewise the second and fourth transistors Tx2, TR2 are arranged in a second cascode, Therefore, the interface 100 employs a split cascode of transistors, with the cascode being split between the transmitter part TX and the receiver part.

In some embodiments the first bias voltage Vb1 may be an adjustable voltage. This enables the first bias voltage Vb1 applied to the third and fourth gates to be adjusted to improve the reflection coefficient of the receiver part, thereby improving the impedance matching of the receiver part RX to the transmitter part TX.

In some embodiments, the third and fourth inductive elements LR1, LR2 may be arranged to have mutual inductance, denoted MR in FIG. 2. In other embodiments, the third and fourth inductive elements LR1, LR2 may be arranged to have no mutual inductance, corresponding to MR=0. In further embodiments, the third and fourth inductive elements LR1, LR2 may each be omitted, each being replaced by a short-circuit such that the third source s3 is coupled directly to the first receiver input 8 and such that the fourth source s4 is coupled directly to the second receiver input 9. The inclusion of the third and fourth inductive elements LR1, LR2 enables parasitic capacitance to be at least partially compensated, thereby enabling a high bandwidth. The inclusion of mutual inductance enables the inductance to be increased without requiring additional chip area for the third and fourth inductive elements, or conversely enables the inductance to be provided using a smaller chip area.

In the embodiment of FIG. 2, the first inductive load 14 comprises a fifth inductive element Ld1 coupled in series with a first resistive element R1, and the second inductive load 15 comprises a sixth inductive element Ld2 coupled in series with a second resistive element R2. In some embodiments, the fifth and sixth inductive element Ld1, Ld2 may be arranged to have mutual inductance, denoted MD in FIG. 2. Therefore, the first and second inductive loads 14, 15 may have mutual inductance MD. In other embodiments, the fifth and sixth inductive elements Ld1, Ld2, and therefore the first and second inductive loads 14, 15, may be arranged to have no mutual inductance, corresponding to MD=0. The inclusion of mutual inductance enables the inductance to be increased without requiring additional chip area for the first and second inductive loads, or conversely enables the inductance to be provided using a smaller chip area.

The second coupling transistor Tsp is arranged to operate as a switch for enabling and disabling the receiver part RX in response to a receive enable control signal EnRB applied at a gate of the second coupling transistor Tsp. In other embodiments, the second coupling transistor Tsp may be omitted, instead being replaced by a short-circuit between the second node 16 and the second voltage rail 13.

The second voltage rail 13 provides a second voltage Vdd, which is typically higher than the first voltage Vss.

In the embodiment of FIG. 2, the receiver part RX comprises a second variable resistance element RT coupled between the third source s3 and the fourth source s4. In other embodiments the second variable resistance element RT may be omitted, being replaced instead by an open-circuit between the third source s3 and the fourth source s4, or by a fixed resistance. Inclusion of the second variable resistance element RT enables the impedance matching of the receiver part RX to the transmitter part TX, and any intervening interconnections such as transmission lines, to be improved.

In some embodiments, the electronic apparatus 200 may also comprise an output stage 20, illustrated in the embodiment of FIG. 2 located in the second integrated circuit chip CHIP B. The output stage 20 has a first input 21 coupled to the first receiver output 10, a second input 22 coupled to the second receiver output 11, and an output 23 for delivering data received from the transmitter part TX. Embodiments of the output stage 20 are described below.

Figure 3:
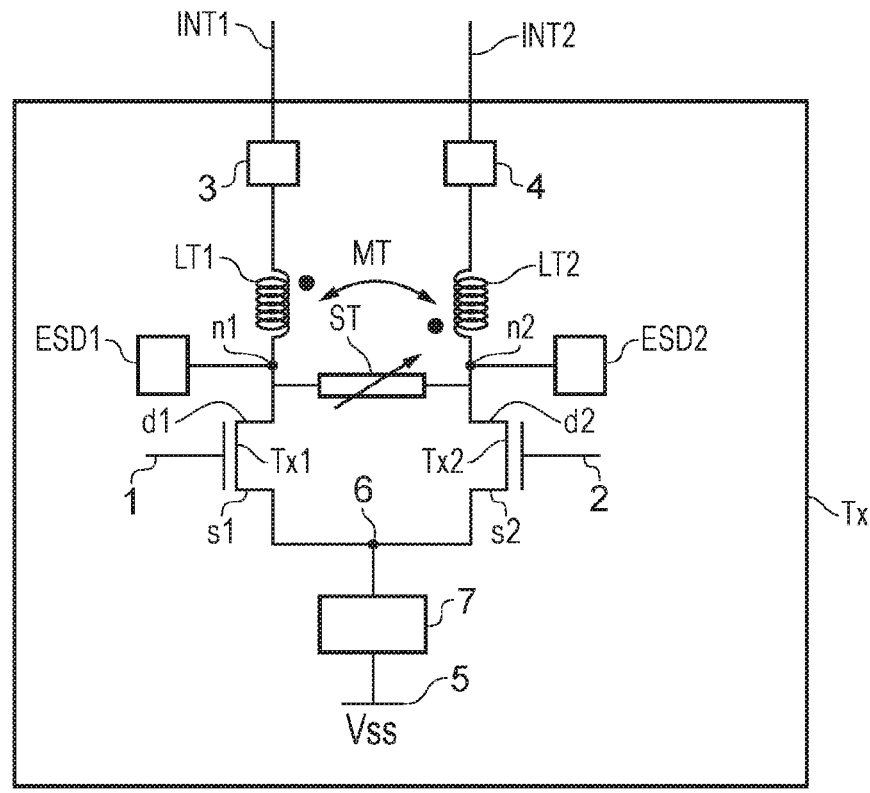
FIG. 3 is a schematic diagram of a transmitter part of an interface.

The first and second integrated circuit chips CHIP A, CHIP B may include protection against electrostatic discharge (ESD). Protection against ESD may be provided by coupling ESD protection circuits to each of the integrated circuit connection pads. A preferred scheme of ESD protection is illustrated in FIG. 3 using the transmitter part TX as an example. FIG. 3 includes all elements of the transmitter part TX illustrated in FIG. 2, although for clarity some reference numerals have not been reproduced, and additionally includes a first ESD protection circuit ESD1 coupled to a first junction n1 between the first drain d1 and the first inductive element LT1, and also includes a second ESD protection circuit ESD1 coupled to a second junction n2 between the second drain d2 and the second inductive element LT2. Therefore, in this preferred scheme, the first and second ESD protection circuits ESD1, ESD2 are not coupled directly to the first and second transmitter outputs 3, 4 respectively, which may be pads, but instead are coupled to the first and second transmitter outputs 3, 4 via, respectively, the first and second inductive elements LT1, LT2. Therefore, the first electrostatic discharge protection circuit ESD1 is coupled to the first drain d1, and first junction n1, such that the first electrostatic discharge protection circuit ESD1 is coupled to the first transmitter output 3 by means of the first inductive element LT1. Similarly, the second electrostatic discharge protection circuit ESD2 is coupled to the second drain d2, and second junction n2, such that the second electrostatic discharge protection circuit ESD2 is coupled to the second transmitter output 4 by means of the second inductive element LT2. This preferred arrangement is advantageous because the inductance, both self and mutual, of the first inductive element LT1 can at least partially compensate for the parasitic capacitance of the first transmitter output 3, and the inductance, both self and mutual, of the second inductive element LT2 can at least partially compensate for the parasitic capacitance of the second transmitter output 4.

Figure 4:
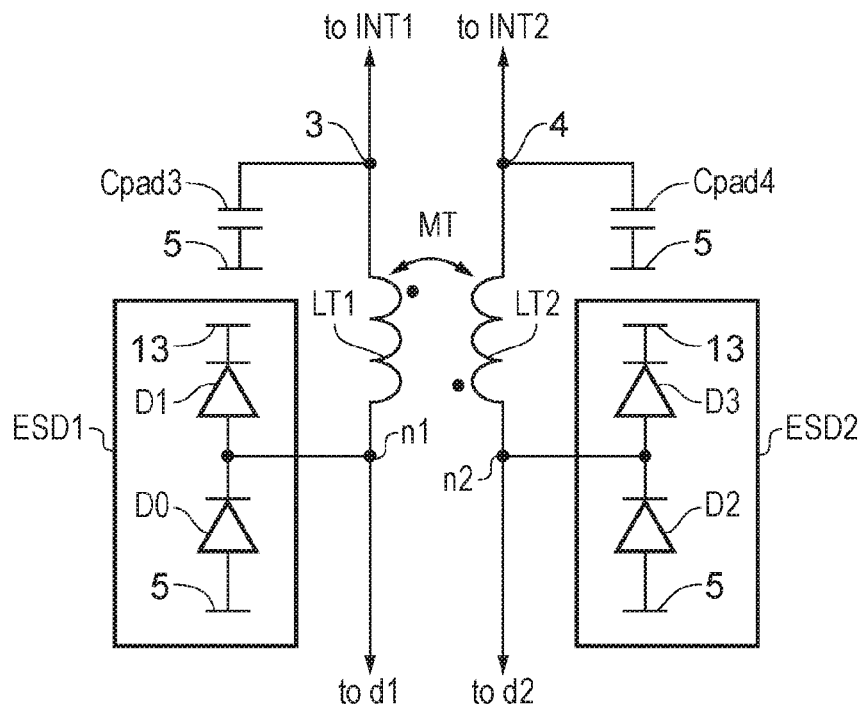
FIG. 4 is a circuit diagram illustrating electrostatic discharge protection.

The ESD protection arrangement of FIG. 3 is illustrated in more detail by the circuit diagram of FIG. 4 where the parasitic capacitance of the first and second transmitter outputs 3, 4 is represented by first and second capacitors Cpad1, Cpad2 respectively. The first ESD protection circuit ESD1 comprises a first diode D0 having an anode coupled to the first voltage rail 5 and a cathode coupled to the first junction n1, and a second diode D1 having an anode coupled to the first junction n1 and a cathode coupled to the second voltage rail 13. Similarly, the second ESD protection circuit ESD2 comprises a third diode D2 having an anode coupled to the first voltage rail 5 and a cathode coupled to the second junction n2, and a fourth diode D3 having an anode coupled to the second junction n2 and a cathode coupled to the second voltage rail 13.

Figure 5:
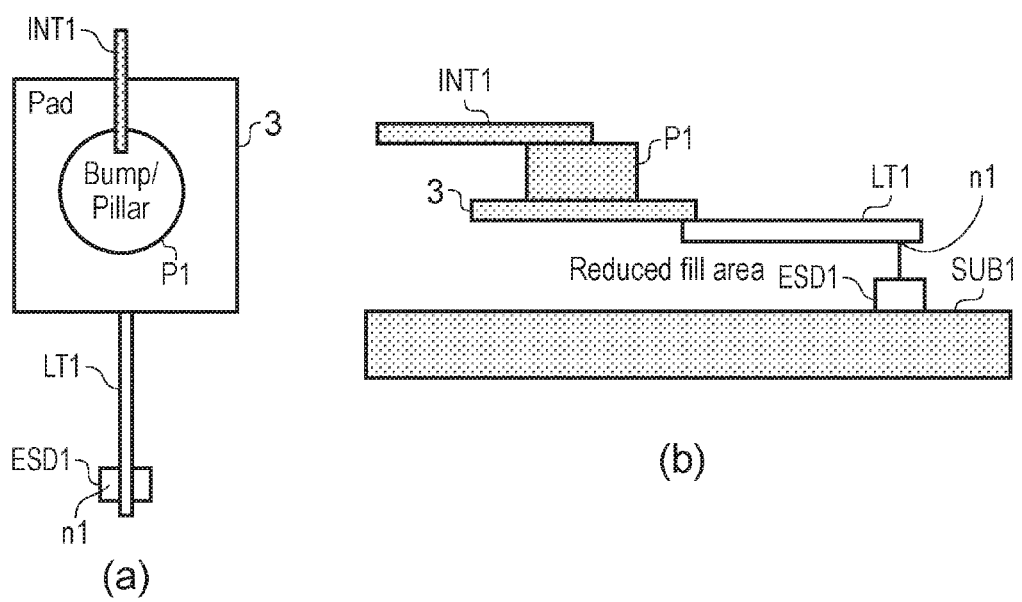
FIG. 5 is a schematic diagram illustrating an embodiment of electrostatic discharge protection and pad connection structure.

FIG. 5(a) illustrates a plan view of the preferred ESD protection arrangement for the first transmitter output 3, where the first transmitter output 3 is provided as a pad, and a corresponding cross-section view is illustrated in FIG. 5(b). A corresponding arrangement may be used for the second transmitter input 4. A metal bump or pillar P1 is mounted on the pad of the first transmitter output 3, and the first interconnection INT1 is mounted on the bump or pillar P1. The first inductive element LT1 extends between the pad of the first transmitter output 3 and the first junction n1, and the first ESD protection circuit ESD1, which is mounted under the first inductive element LT1 on a first substrate SUB1 of the first integrated circuit chip CHIP A, is coupled to the first junction n1. Therefore, the first ESD protection circuit ESD1 is spaced apart from the first transmitter output 3 by the first inductive element LT1. More specifically, the point at which the first ESD protection circuit ESD1 is coupled to the other elements of the transmitter part TX, that is the first junction n1, is physically spaced apart from the pad of the first transmitter output 3 by the length of the first inductive element LT1. Also, by locating the first ESD protection circuit ESD1 under the first inductive element LT1, the volume of metal fill needed to balance the metal density during chip manufacture is reduced.

Figure 6:
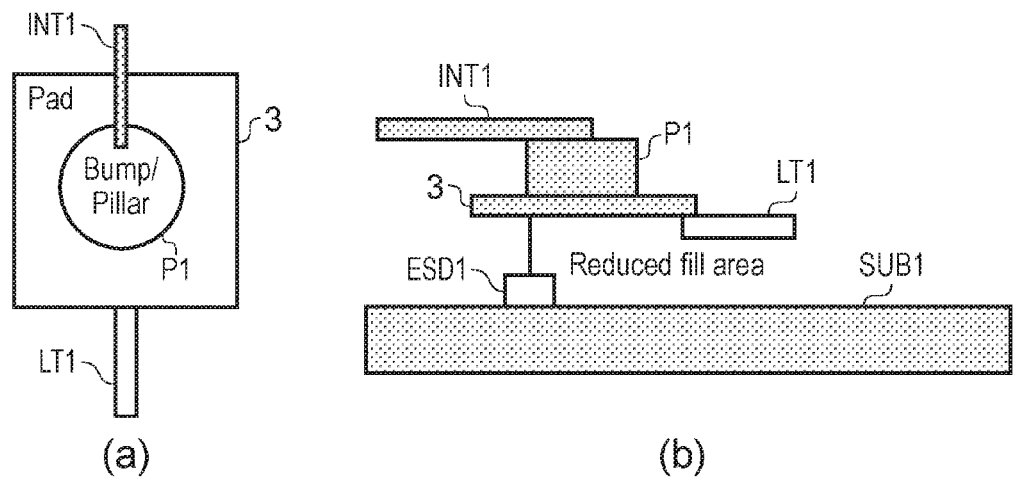
FIG. 6 is a schematic diagram illustrating another embodiment of electrostatic discharge protection and pad connection structure.

In an alternative, less-preferred scheme for ESD protection, the first ESD protection circuit ESD1 may be located under the pad of the first transmitter output 3 and coupled directly to the first transmitter output 3 instead of via the first inductive element LT1, and likewise the second ESD protection circuit ESD2 may be located under the pad of the second transmitter output 4 and coupled directly to the second transmitter output 4 instead of via the second inductive element LT2. However, in this alternative scheme the first and second inductive elements LT1, LT2 are not able to compensate for the parasitic capacitance of the first and second transmitter outputs 3, 4 respectively, which can degrade high frequency performance. This alternative scheme is illustrated in plan view in FIG. 6(a) and in a corresponding cross-section view in FIG. 6(b). In particular, the first ESD protection circuit ESD1 is not visible in FIG. 6(a) as it is located underneath the pad of the first transmitter output 3, as illustrated in FIG. 6(b), and is not coupled directly to the first inductive element LT1 but is instead coupled directly to the first transmitter output 3, as illustrated in FIG. 6(b). Again, by locating the first ESD protection circuit ESD1 under the pad of the first transmitter output 3, the volume of metal fill needed to balance the metal density during chip manufacture is reduced.

Figure 7:
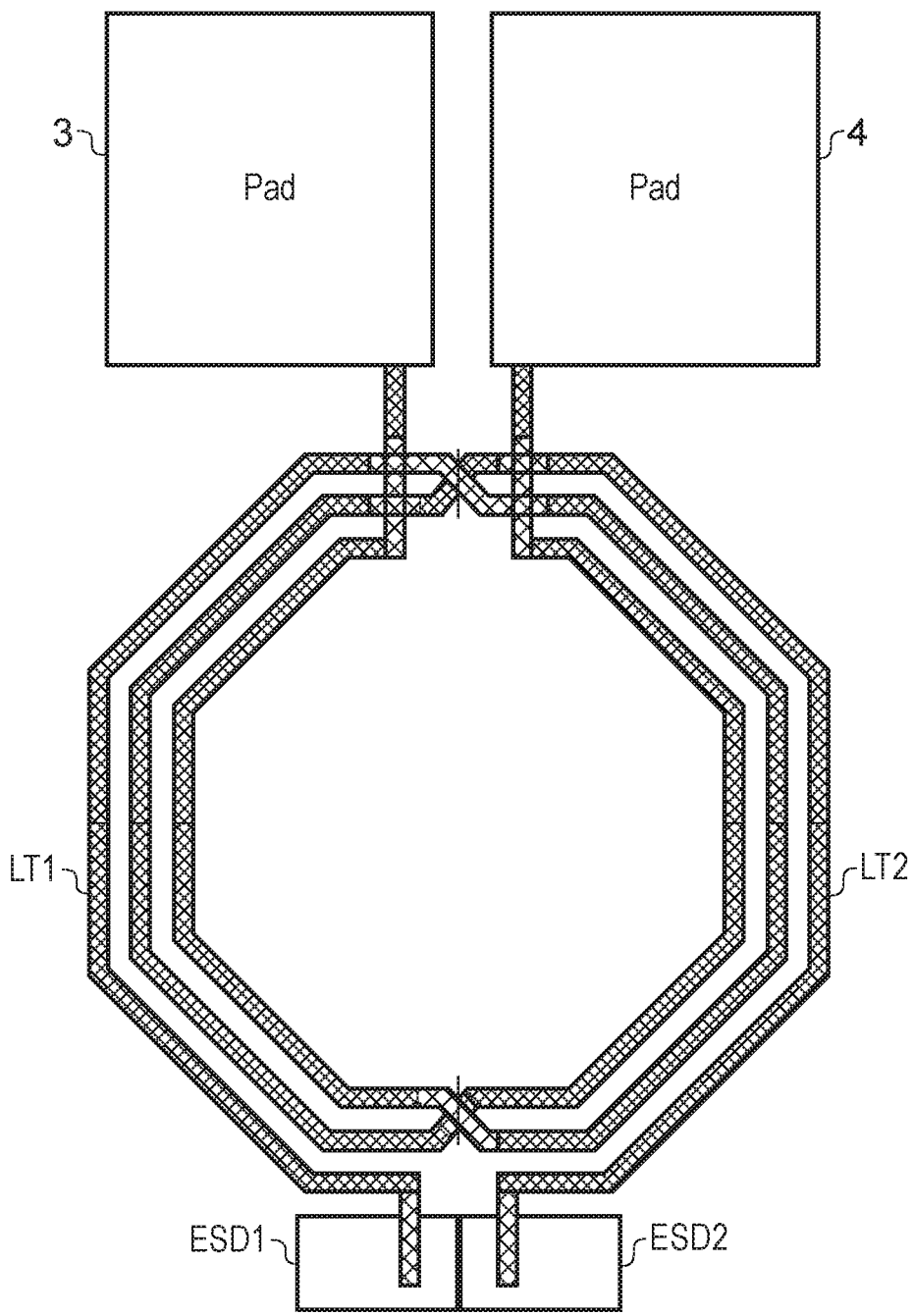
FIG. 7 is a schematic diagram illustrating an embodiment of a layout of symmetrical paralleled inductive elements with mutual inductance.

FIG. 7 illustrates one way of laying out the first and second inductive elements LT1, LT2 in a symmetrical paralleled inactive component on the first integrated circuit chip CHIP A for the preferred ESD protection scheme described above with reference to FIGS. 3 to 5, although other layouts may be used instead. The layout illustrated in FIG. 7 provides self inductance, mutual inductance between the first and second inductive elements LT1, LT2, and also a high quality (Q) factor. The first inductive element LT1 is formed by a first coil coupled between the first transmitter output 3 and the first ESD protection circuit ESD1, and the second inductive element LT2 is formed by a second coil coupled between the second transmitter output 4 and the second ESD protection circuit ESD2, the windings of the first and second coils running side-by-side and parallel to each other. The third and fourth inductive elements LR1, LR2 may be laid out in a similar manner with coiled windings in parallel to provide self inductance and mutual inductance. Likewise, the fifth and sixth inductive elements Ld1, Ld2 may be laid out in a similar manner with coiled windings in parallel to provide self inductance and mutual inductance, although in this case the fifth and sixth inductive elements Ld1, Ld2 are not coupled directly to connection pads or to ESD protection circuits. In an alternative layout of the fifth and sixth inductive elements Ld1, Ld2, a single coil could be provided, being divided into two inductive elements by means of a centre tap.

Figure 8:
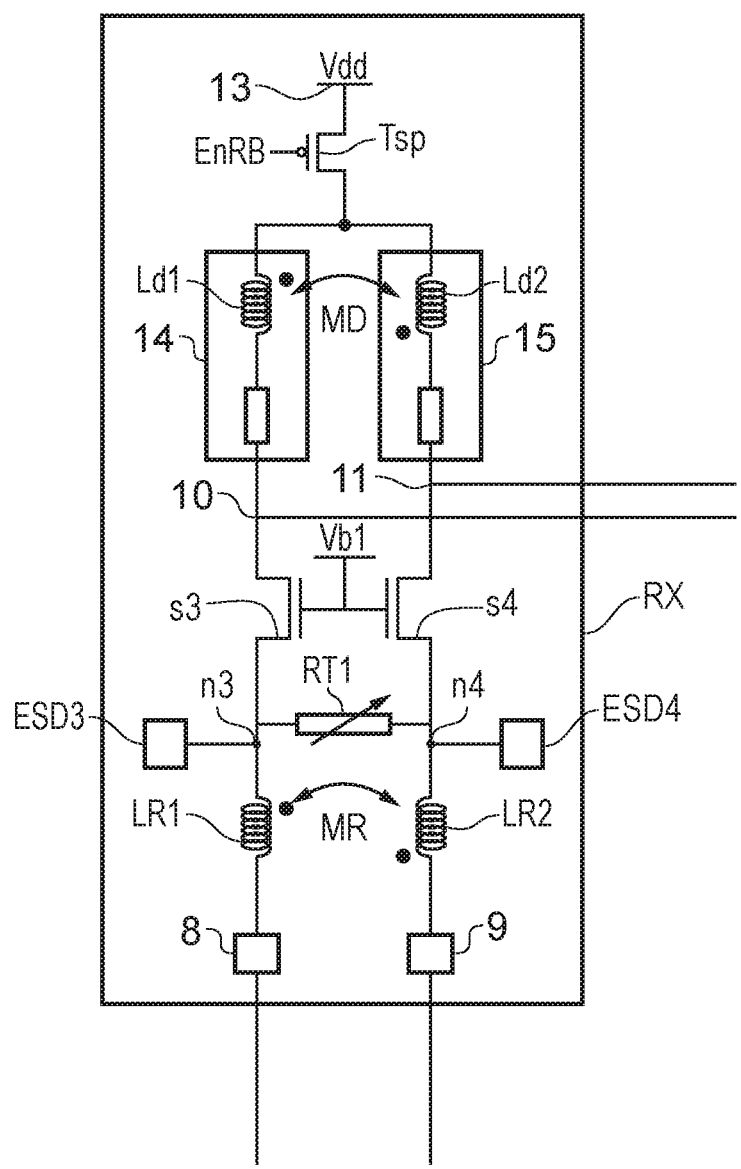
FIG. 8 is a schematic diagram of a receiver part of an interface.

A preferred scheme of electrostatic protection may be provided for the receiver part RX in a corresponding manner to the preferred scheme of electrostatic protection described above in relation to the transmitter part TX, as illustrated in FIG. 8. FIG. 8 includes all elements of the receiver part RX illustrated in FIG. 2, although for clarity some reference numerals have not been reproduced, and additionally includes a third ESD protection circuit ESD3 coupled to a third junction n3 between the third source s3 and the third inductive element LR1, and also includes a fourth ESD protection circuit ESD4 coupled to a fourth junction n42 between the fourth source s4 and the fourth inductive element LR2. Therefore, in this preferred scheme, the third and fourth ESD protection circuits ESD3, ESD4 are not coupled directly to the first and second receiver inputs 8, 9 respectively, which may be pads, but instead are coupled to the first and second receiver inputs 8, 9 via, respectively, the third and fourth inductive elements LR1, LR2. Therefore, the third electrostatic discharge protection circuit ESD3 is coupled to the third source s3, and third junction n3, such that the third electrostatic discharge protection circuit ESD3 is coupled to the first receiver input 8 by means of the third inductive element LR1. Similarly, the fourth electrostatic discharge protection circuit ESD4 is coupled to the fourth source s4, and fourth junction n4, such that the fourth electrostatic discharge protection circuit ESD4 is coupled to the second receiver input 9 by means of the fourth inductive element LR2. This preferred arrangement is advantageous because the inductance, both self and mutual, of the third inductive element LR1 can at least partially compensate for the parasitic capacitance of the first receiver input 8, and the inductance, both self and mutual, of the fourth inductive element LR2 can at least partially compensate for the parasitic capacitance of the second receiver input 9. The third and fourth ESP protection circuits ESD3, ESD4 may have the same arrangement of diodes as the first and second ESD protection circuits ESD1, ESD2 described above, and a corresponding physical arrangement to that described above with reference to FIGS. 5(a) and (b).

Figure 9:
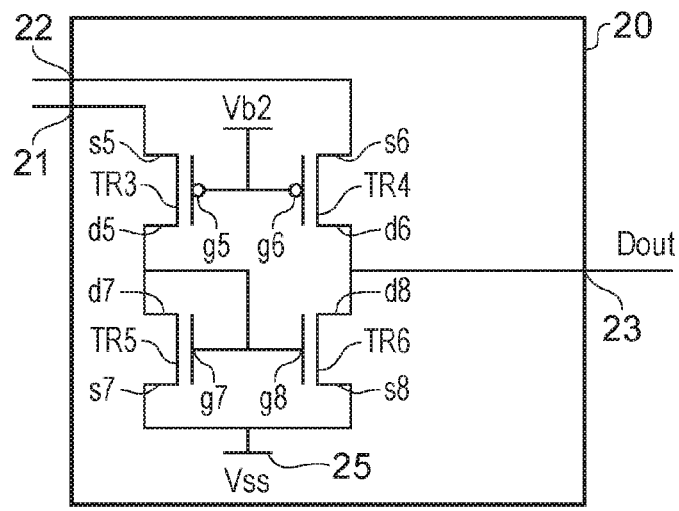
FIG. 9 is a schematic diagram of an output stage.

Referring to FIG. 9, which illustrates an embodiment of the output stage 20, a first p-channel transistor TR3 has a fifth source s5 coupled to the first receiver output 10 by means of the first input 21, a fifth gate g5 coupled to a second bias voltage Vb2, and a fifth drain d5. A second p-channel transistor TR4 has a sixth source s6 coupled to the second receiver output 11 by means of the second input 22, a sixth gate g6 coupled to the second bias voltage Vb2, and a sixth drain d6. Therefore, the first and second p-channel transistors TR3, TR4 are arranged in a common gate configuration. A first n-channel transistor TR5 has a seventh drain d7 coupled to the fifth drain d5, a seventh gate g7 coupled to the seventh drain d7, and a seventh source s7 coupled to a third voltage rail 25. A second n-channel transistor TR6 has an eighth drain d8 coupled to the sixth drain d6, an eighth gate g8 coupled to the seventh gate g7, and an eighth source s8 coupled to the third voltage rail 25. Therefore, the first and second n-channel transistors TR5, TR6 are arranged as a current mirror. The use of p-channel transistors for the common gate configuration enables a high bandwidth as p-channel transistors can have a better high frequency response than would the use of n-channel transistors in the common gate configuration. The first data output 23 is coupled to the sixth drain d6 for delivering output data Dout as a single-ended binary signal.

Figure 10:
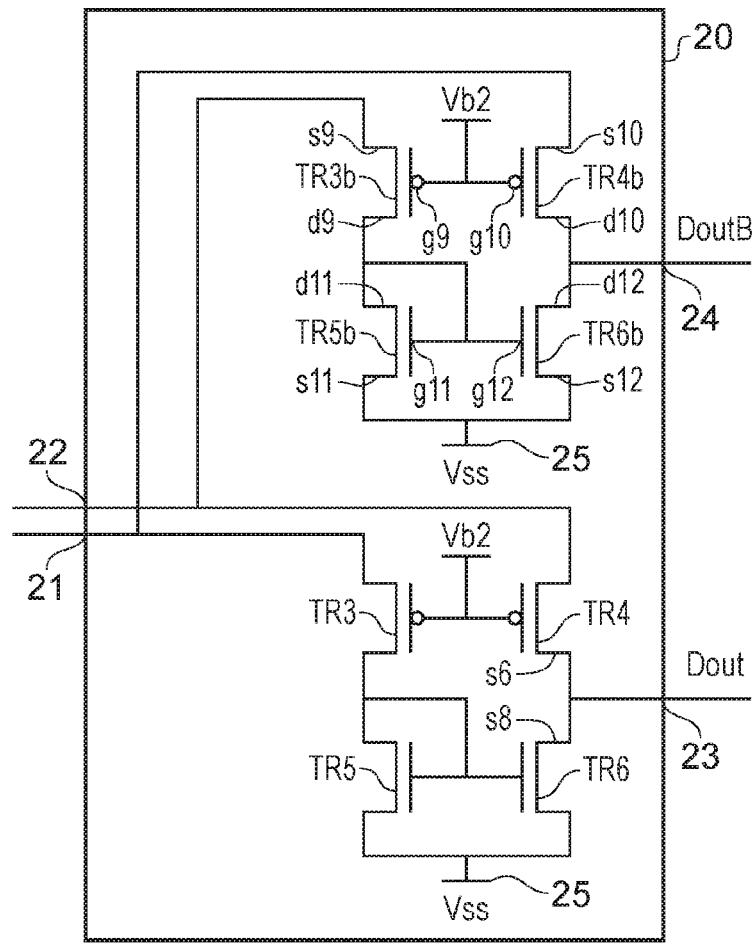
FIG. 10 is a schematic diagram of an output stage.

FIG. 10 illustrates another embodiment of the output stage 20 that delivers the output data Dout and also the complement, that is, logical inverse, of the output data Dout, identified in FIG. 9 as DoutB, as a second binary signal. The output stage 20 illustrated in FIG. 10 includes all the elements of the output stage 20. In addition, a third p-channel transistor TR3b has a ninth source s9 coupled to the second receiver output 11 by means of the second input 22, a ninth gate g9 coupled to the second bias voltage Vb2, and a ninth drain d9. A fourth p-channel transistor TR4b has a tenth source s10 coupled to the first receiver output 10 by means of the first input 21, a tenth gate g10 coupled to the second bias voltage Vb2, and a tenth drain d10. Therefore, the third and fourth p-channel transistors TR3b, TR4b are arranged in a common gate configuration. A third n-channel transistor TR5b has an eleventh drain d11 coupled to the ninth drain d9, an eleventh gate g11 coupled to the eleventh drain d11, and an eleventh source s11 coupled to the third voltage rail 25. A fourth n-channel transistor TR6b has a twelfth drain d12 coupled to the tenth drain d10, an twelfth gate g12 coupled to the eleventh gate g11, and a twelfth source s12 coupled to the third voltage rail 25. Therefore, the third and fourth n-channel transistors TR5b, TR6b are arranged as a current mirror. Again, the use of p-channel transistors for the common gate configuration enables a high bandwidth as p-channel transistors can have a better high frequency response than would the use of n-channel transistors in the common gate configuration. The second data output 24 is coupled to the tenth drain d10 for delivering the complement, DoutB, of the output data Dout as a second single-ended signal.

Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale, emphasis instead generally being placed upon illustrating the principles of the present invention.

The invention claimed is:

1. An interface for inter-chip communication, comprising:
a transmitter circuit configured to transmit a differential signal and a receiver circuit configured to receive the differential signal, the transmitter circuit being provided in a first integrated circuit chip and the receiver circuit being provided in a second integrated circuit chip;
wherein the transmitter circuit comprises:
a first transmitter input for an input binary signal and a second transmitter input for the complement of the input binary signal;
a first transmitter output for a first part of the differential signal and a second transmitter output for a second, complementary part of the differential signal;
a first transistor having a first gate coupled to the first transmitter input, a first source coupled to a first node, and a first drain coupled to the first transmitter output;
a second transistor having a second gate coupled to the second transmitter input, a second source coupled to the first node, and a second drain coupled to the second transmitter output; and
wherein the first node is coupled to a first voltage rail by means of a first coupling element; and
wherein the receiver circuit comprises:
a first receiver input coupled to the first transmitter output for receiving the first part of the differential signal and a second receiver input coupled to the second transmitter output for receiving the second, complementary part of the differential signal;
a first receiver output for an output binary signal and a second receiver output for the complement of the output binary signal;
a third transistor having a third gate coupled to a first bias voltage, a third source coupled to the first receiver input, a third drain coupled to the first receiver output, the third drain also coupled to a second voltage rail by means of a first inductive load; and
a fourth transistor having a fourth gate coupled to the first bias voltage, a fourth source coupled to the second receiver input, a fourth drain coupled to the second receiver output, the fourth drain also coupled to the second voltage rail by means of a second inductive load.

2. The interface of claim 1, wherein, in the transmitter circuit, the first drain is coupled to the first transmitter output by means of a first inductive element and the second drain is coupled to the second transmitter output by means of a second inductive element.

3. The interface of claim 2, wherein the first and second inductive elements are arranged to have mutual inductance.

4. The interface of claim 2, wherein the transmitter circuit comprises:
a first electrostatic discharge protection circuit coupled to the first drain, such that the first electrostatic discharge protection circuit is coupled to the first transmitter output by means of the first inductive element; and
a second electrostatic discharge protection circuit coupled to the second drain, such that the second electrostatic discharge protection circuit is coupled to the second transmitter output by means of the second inductive element.

5. The interface of claim 1, wherein the transmitter circuit comprises a first variable resistance element coupled between the first drain and the second drain.

6. The interface of claim 1, wherein, in the receiver circuit, the third source is coupled to the first receiver input by means of a third inductive element and the fourth source is coupled to the second receiver input by means of a fourth inductive element.

7. The interface of claim 6, wherein the third and fourth inductive elements are arranged to have mutual inductance.

8. The interface of claim 6, wherein the receiver circuit comprises:
   a third electrostatic discharge protection circuit coupled to the third source, such that the third electrostatic discharge protection circuit is coupled to the first receiver input by means of the third inductive element; and
   a fourth electrostatic discharge protection circuit coupled to the fourth source, such that the fourth electrostatic discharge protection circuit is coupled to the second receiver input by means of the fourth inductive element.

9. The interface of claim 1, wherein the receiver circuit comprises a second variable resistance element coupled between the third source and the fourth source.

10. The interface of claim 1, wherein the first and second inductive loads are arranged to have mutual inductance.

11. The interface of claim 1, wherein the first bias voltage is an adjustable voltage.

12. An electronic apparatus comprising the interface of claim 1.

13. The electronic apparatus of claim 12, further comprising an output stage, the output stage comprising:
   a first p-channel transistor having a fifth source coupled to the first receiver output, a fifth gate coupled to a second bias voltage, and a fifth drain;
   a second p-channel transistor having a sixth source coupled to the second receiver output, a sixth gate coupled to the second bias voltage, and a sixth drain;
   a first n-channel transistor having seventh drain coupled to the fifth drain, a seventh gate coupled to the seventh drain, and a seventh source coupled to a third voltage rail;
   a second n-channel transistor having an eighth drain coupled to the sixth drain, an eighth gate coupled to the seventh gate, and an eighth source coupled to the third voltage rail; and
   a first data output coupled to the sixth drain.

14. The electronic apparatus of claim 12, wherein the electronic apparatus is a wireless communication device.

* * * * *